United States Patent [19]

Sauer

[11] 4,010,485
[45] Mar. 1, 1977

[54] CHARGE-COUPLED DEVICE INPUT CIRCUITS

[75] Inventor: Donald Jon Sauer, Plainsboro, N.J.

[73] Assignee: RCA Corporation, New York, N.Y.

[22] Filed: June 13, 1974

[21] Appl. No.: 479,050

[52] U.S. Cl. .............................. 357/24; 307/221 D; 307/304
[51] Int. Cl.$^2$ ........................................ H01L 29/78
[58] Field of Search ..... 357/24; 307/221 C, 221 D, 307/304

[56] References Cited

UNITED STATES PATENTS

| | | | |
|---|---|---|---|
| 3,811,055 | 5/1974 | Weimer ............................... | 357/24 |
| 3,876,952 | 4/1975 | Weimer ............................... | 357/24 |
| 3,914,748 | 10/1975 | Barton et al. ......................... | 357/24 |

OTHER PUBLICATIONS

W. Kosonocky, "Two–Phase CCDs" RCA Technical Notes, TN 931, 4-26-73, pp. 1, 2.

Primary Examiner—Michael J. Lynch
Assistant Examiner—Joseph G. Clawson, Jr.
Attorney, Agent, or Firm—H. Christoffersen; Samuel Cohen

[57] ABSTRACT

The charge known as "fat zero", employed to reduce charge transfer losses in charge coupled device (CCD) registers is introduced at a fixed ratio to the binary one charge level. This is accomplished by employing two CCD channels having different widths, one for signals, the other for fat zeros, which channels converge into a common channel. The same voltages are employed for the introduction of both charges so that only the geometry of the channels determines the binary one to fat zero charge signal ratio.

6 Claims, 8 Drawing Figures

LEGEND
☒ = CONNECTION BETWEEN POLYSILICON & ALUMINUM

CHARGE-COUPLED DEVICE INPUT CIRCUITS

A limitation on the performance of surface channel CCD shift registers is the incomplete charge transfer due to trapping of charge by "fast interface states" existing in the forbidden gap at the semiconductor-insulator interface. It is well known in the art that such transfer loss may be greatly reduced by operating in the so called "fat zero" mode. In this mode, a binary zero is represented by a relatively small charge level (a "fat-zero") rather than by no charge and a binary one is represented by a charge of a magnitude close to the full storage capacity of a potential well beneath a storage electrode. When operating in the fat zero mode, the net amount of signal which can be trapped during the transfer of a signal from one storage well to the next adjacent well, that is, between the signal supplied to a potential well during one clock pulse and that subsequently removed from the well during a following clock pulse, is relatively low. The reason is that the interface state traps are almost completely filled during each shift cycle and the amount of trapping which does occur is small and is about the same during each shift cycle.

One problem dealt with in the present application is that of establishing, in the fat zero operating mode, a fixed ratio between a binary one charge signal level and a fat zero charge signal level. Should this ratio vary widely, then the signal to noise ratio becomes poor, that is, it becomes more difficult to distinguish a binary one signal from a binary zero signal.

In a preferred embodiment of the present invention, the ratio discussed above is maintained relatively fixed by introducing the fat zero signal into one channel and the signal charge into a separate channel. The same voltages are employed to produce, for example, a fat zero in its channel as to produce a binary one charge level in the signal channel; however, the geometry of the channels may be different. For example, the fat zero channel may be substantially narrower than the signal channel so that the amount of charge introduced into the fat zero channel is substantially smaller than that introduced into the signal channel. These two signals subsequently are combined by converging the two channels into a common channel.

A similar technique, that is, the use of a separate input channel is employed in the present invention to introduce a pre-charge bit packet into a register, for filling the traps at the semiconductor-insulator interface, prior to introducing signal information into the register.

The invention is illustrated in the drawing of which:

Figure 1:
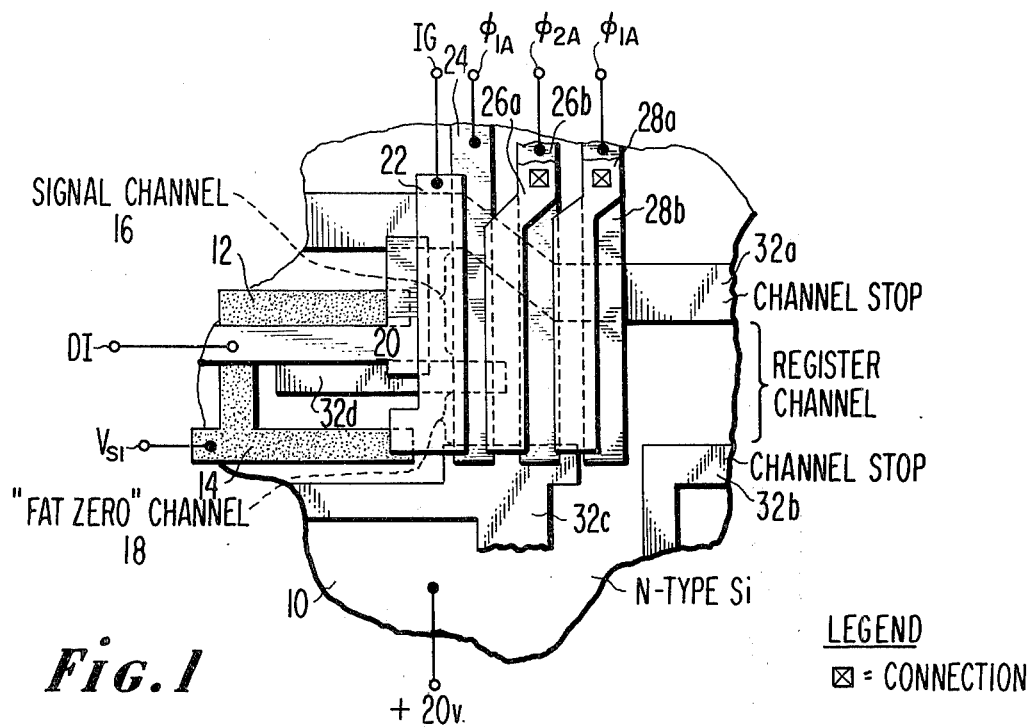
FIG. 1 is a plan view of a CCD structure according to one embodiment of the invention.
Figure 2:
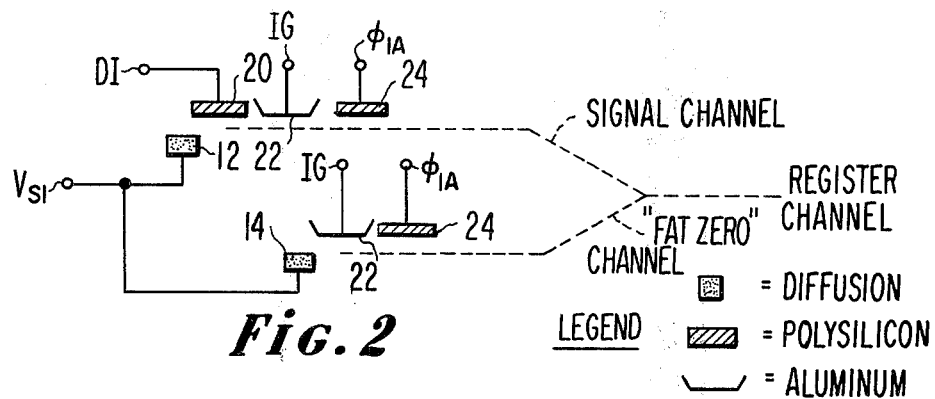
FIG. 2 is a schematic diagram of the structure of FIG. 1.
Figure 3:
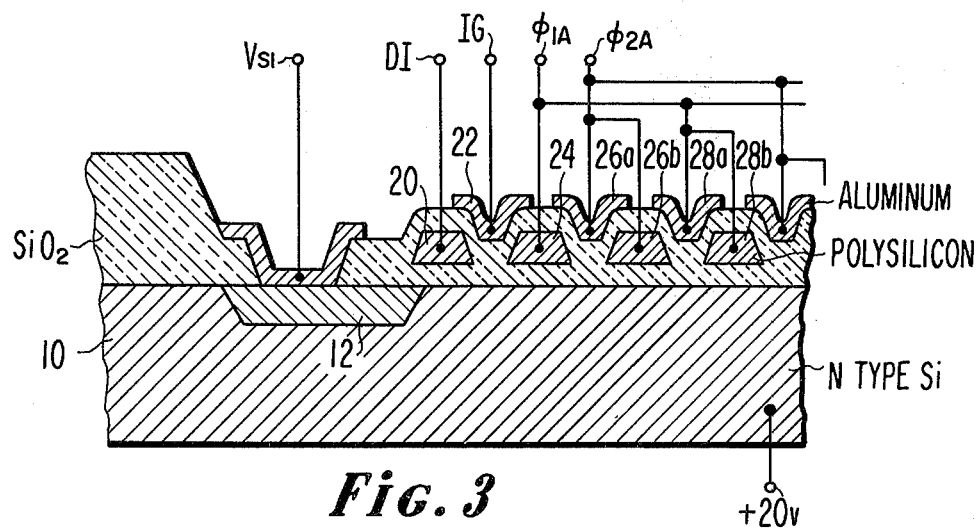
FIGS. 3 and 4 are cross sections through the signal channel and fat zero channel, respectively, of the structure of FIG. 1.
Figure 4:
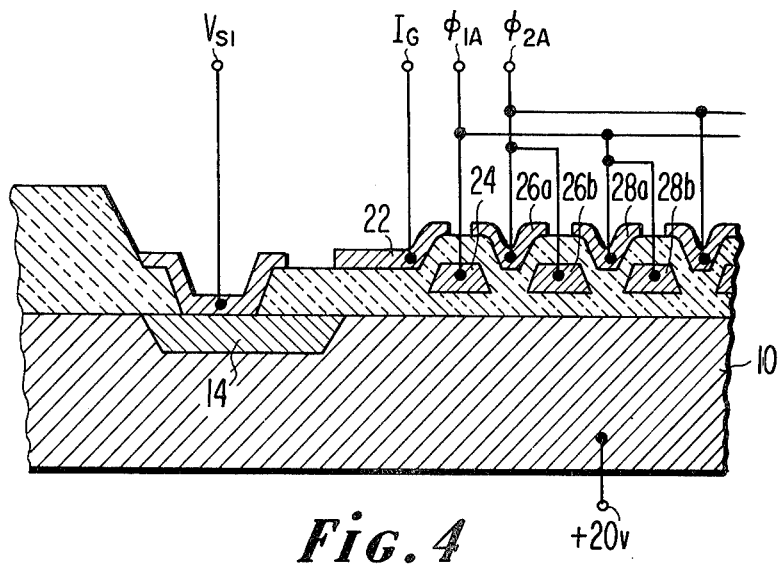

The circuit of FIGS. 1–4 includes an N type silicon substrate 10 and P type regions 12 and 14 which serve as sources of minority carriers (holes in the case of the N type substrate illustrated).

The upper channel illustrated is the signal channel 16 and the lower channel the fat zero channel 18. The signal channel includes, in addition to the source electrode 12, a polysilicon gate electrode 20 for receiving data input signals DI, followed by an aluminum gate electrode 22. Electrode 22 overlaps a polysilicon electrode 24 and following this electrode are pairs of electrodes 26a, 26b; 28a, 28b; and so on. The electrodes following electrode 28b are now shown.

The fat zero channel includes the same electrodes as the signal channel 16 except for the data input electrode 20. An important feature of the fat zero channel is that its width has a predetermined relationship to that of the signal channel 16. In the embodiment of the invention illustrated, the fat zero channel width is about one-third that of the signal channel 16. For very narrow channel devices, where edge effects become more dominant, a 50% or more of full well fat zero signal may be desirable and in such case the fat zero channel would be wider than shown.

The channel "stops" such as 32a–32d are highly doped N type diffusions in the N type substrate. These stops are maintained at the substrate potential which creates potential barriers between adjacent channels to prevent the flow of charge from one channel to the next adjacent channel (not shown). Because the impurity concentration of the diffusions is so high, the voltages on the conductors such as 28a, 28b and so on which pass over the diffusuions cause substantially no depletion to occur and therefore have substantially no effect on the potential barriers created by the channel stops.

Figure 5:
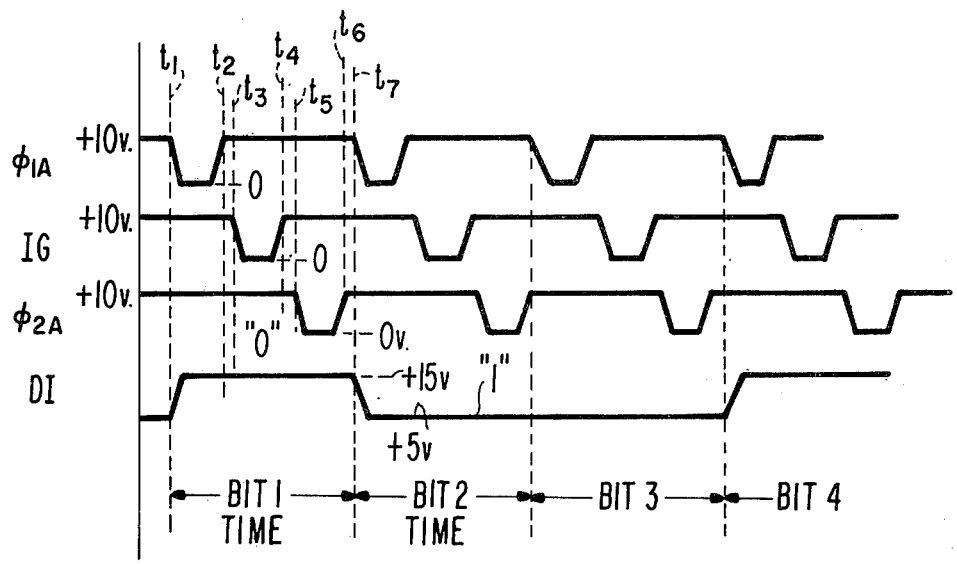
FIG. 5 is a drawing of waveforms employed in the operation of the structure of FIG. 1.

The operation of the circuit may be better understood by referring to the waveforms of FIG. 5. It may be assumed for purposes of the present illustration that the N type substrate is biased relatively positively to the extent of +20 volts and that the source electrode 14 is at $V_{S1}=+15$ volts which level is just below the depleted surface potential under an aluminum gate biased at +10 volts. During the "bit 1" time, the input DI goes relatively positive to +15 volts. This creates a potential barrier in the substrate beneath electrode 20, that is, between the source electrode 12 (see FIG. 3) and the potential well beneath the polysilicon electrode 24. Accordingly, when during the time $t_3$ to $t_4$ the relatively negative-going (the portion of the wave at zero volts) charge transfer pulse IG occurs, minority carriers (holes) are prevented from being transferred from the source electrode 12 to the potential well beneath electrode 24.

Turning now to the fat zero channel, its source electrode 14 is maintained at the same relative positive potential $V_{S1}=+15$ volts as is source electrode 12. Once each period, the relatively negative transfer pulse $I_G$ occurs. This causes a conduction channel to form beneath electrode 22 (see FIG. 4). During this time, the polysilicon electrode 24 is at +10 volts which is positive but which is relatively more negative than the +20 volt bias applied to the substrate 10. Accordingly, a potential well is present beneath electrode 24 in the fat zero channel and charge (holes) unconditionally transfers from the source electrode 14 to this potential well. The flow of holes continues until the surface potential beneath electrode 24 is substantially equal to that of the source electrode 14 (about +15 volts). The amount of charge which transfers is dependent on the storage capacity of the potential well beneath electrode 24 and this, in turn, is proportional to the amount of surface beneath electrode 24 which is in the fat zero channel 18. This surface area is proportional to the width of the fat zero channel. the charge signal above subsequently is propagated to the right by the application of the $\phi_{2A}$ and then the $\phi_{1A}$ voltages.

At time $t_5$-$t_6$ the relatively negative-going pulse $\phi_{2A}$ (the portion of the wave at zero volts) occurs. This causes the transfer of holes stored in the well beneath electrode 24 to the well beneath electrode pair 26a, 26b. When $\phi_{2A}$ goes relatively positive again (time $t_6$), the charge remains stored beneath polysilicon electrode 26b in the register channel. This charge does not flow backward toward electrode 24 in view of the potential barrier beneath electrode 26a which in the embodiment illustrated is substantially further from the substrate than its paired electrode 26b. Other alternative means such as a direct current offset potential relative to 26b or ion implantation may be used to insure that the surface potential beneath a "transfer gate" such as 26a provides a potential barrier to the flow of charge in the wrong direction.

When the fat zero charge reaches the well beneath electrode 26b it combines there with the signal charge, if any, concurrently propagated to the same well from the signal channel 16. In the present example, since the signal channel has introduced no charge, the combined charge is the fat zero charge. In the present example, the fat zero charge will occupy approximately one-quarter of some fixed portion, such as 90%, of the charge capacity of the potential well beneath electrode 26b. This combined charge subsequently is propagated down the register channel by the two phase voltages $\phi_{1A}$, $\phi_{2A}$ applied to the following electrodes.

During the bit 2 time, the same process as described is repeated. However, during the bit 2 time, a 1 is introduced into the signal channel. The relatively negative (+5 volt) signal level DI applied to polysilicon electrode 20 causes a conduction channel to form beneath this electrode. Now when IG goes relatively negative at time $t_3$, this conduction channel is extended to the region of the substrate beneath electrode 22. Accordingly, holes from source electrode 12 flow through this extended conduction channel to the potential well beneath electrode 24. This flow continues until the surface potential beneath electrode 24 is substantially equal to the source electrode 12 potential.

The amount of charge which accumulates is proportional to the area in the signal channel beneath electrode 24 and this, in turn, is proportional to the width of the signal channel. This amount of charge, in the example illustrated, is three times that of the fat zero charge. In due course, when these two charges, that is, the binary one charge and the fat zero charge, are combined in the well beneath electrode 26b in the register channel, the total charge present will be equivalent to four units of charge and will occupy, in the example given here by way of illustration, 90% of the potential well capacity beneath this electrode. This total charge is defined here as a binary one (and of course is greater than the binary one level in the signal channel 16). In terms of arbitrary units, a binary one in the signal channel is three such units and a binary one in the register channel is four such units. The binary one-to-fat zero ratio in the register channel is four to one.

The important advantage of the structure described above is that the one-to-zero ratio is substantially independent of the voltages which are employed. While care is taken to insure, for example, that the voltage $V_{S1}$ does not vary, if it should vary, this will not affect the binary one to fat zero ratio. If $V_{S1}$ should decrease, for example, both the binary one charge signal level and the fat zero charge signal level will decrease but the one-to-fat zero charge signal ratio will remain constant.

Figure 6:
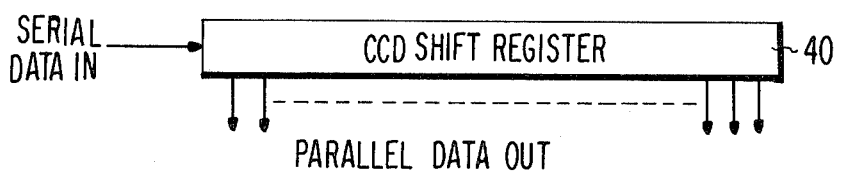
FIG. 6 is a block diagram to illustrate the problem solved in the embodiment of the invention shown in the following figures.

FIG. 6 illustrates another circuit where charge trapping is a problem. It is a CCD shift register 40 which receives data input in serial form and which subsequently transfers this data, in parallel, to an output structure such as a CCD memory matrix. An arrangement of this kind is used in the so-called serial-parallel-serial CCD memory.

In the operation of the register of FIG. 6, if the shift register has say M stages, M bits of data are shifted serially into the register. A strobe pulse is then applied to the transfer gates (not shown explicitly but assumed to be within block 40) to cause the transfer of the M bits, in parallel, from the register 40 to the first row of the memory array. The contents of each row in the array is then shifted, in parallel, to the next row of the array. This process is repeated until the memory array is filled. It might also be mentioned that data may be extracted from the memory array by shifting a row of bits, in parallel, to an output register similar to 40 and then shifting the contents of this register to the output terminal of the register, in serial fashion.

The problem which arises in the system as described above is that after the parallel shift of data from the shift register 40, the potential wells are empty (except for a small amount of residual trapped charge). What this means, in effect, is that the register 40 is no longer operating in the fat zero mode, even though zeros in the serial bit stream subsequently applied to the shift register are "fat zeros." Because the register 40 is "empty," the first bit or possibly the first several bits of the serial bit stream suffer interface state losses. The greater the number of stages in the shift register 40, the greater the losses which are suffered.

Figure 7:
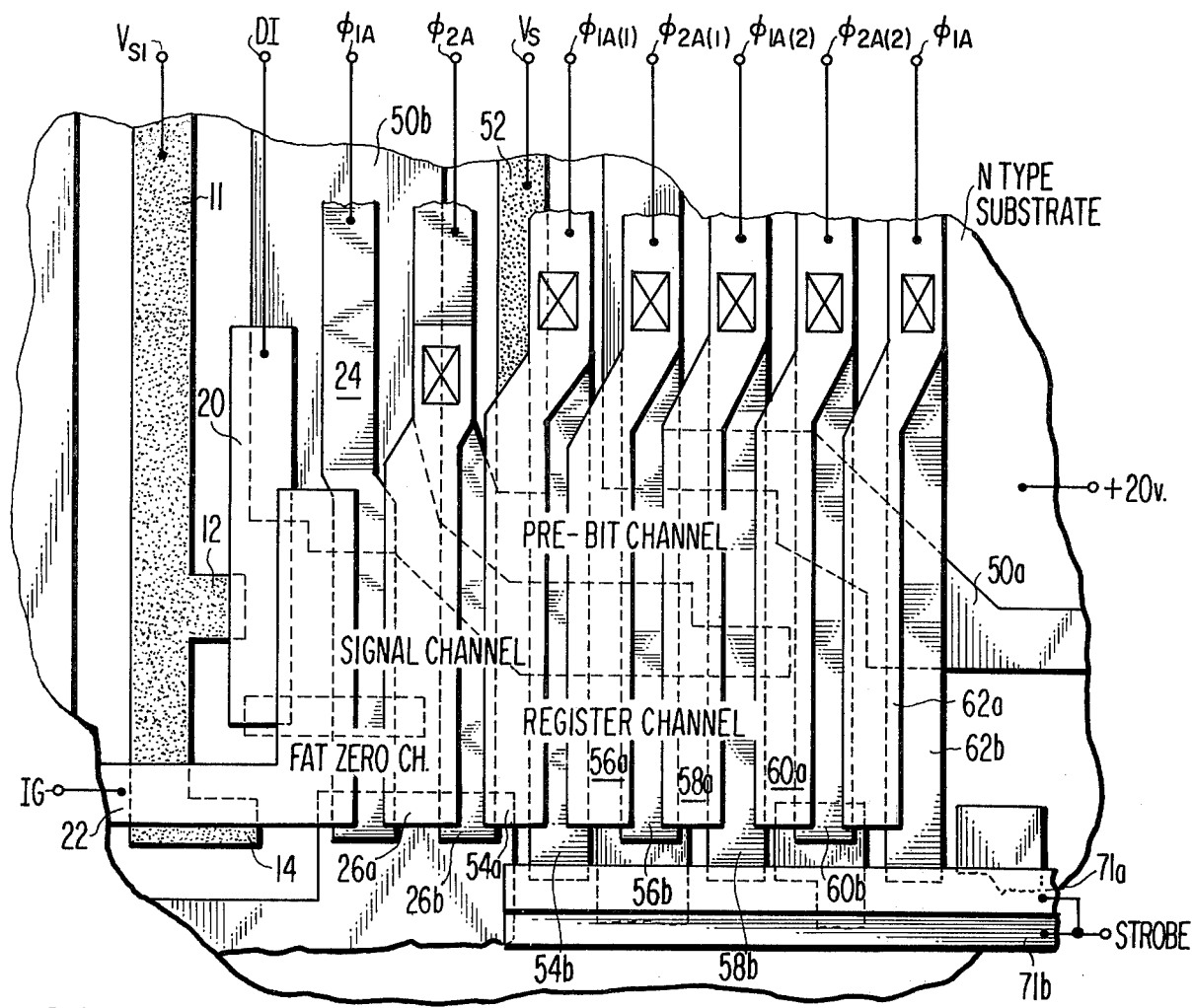
FIG. 7 is a plan view of a CCD structure according to a second embodiment of the invention.
Figure 8:
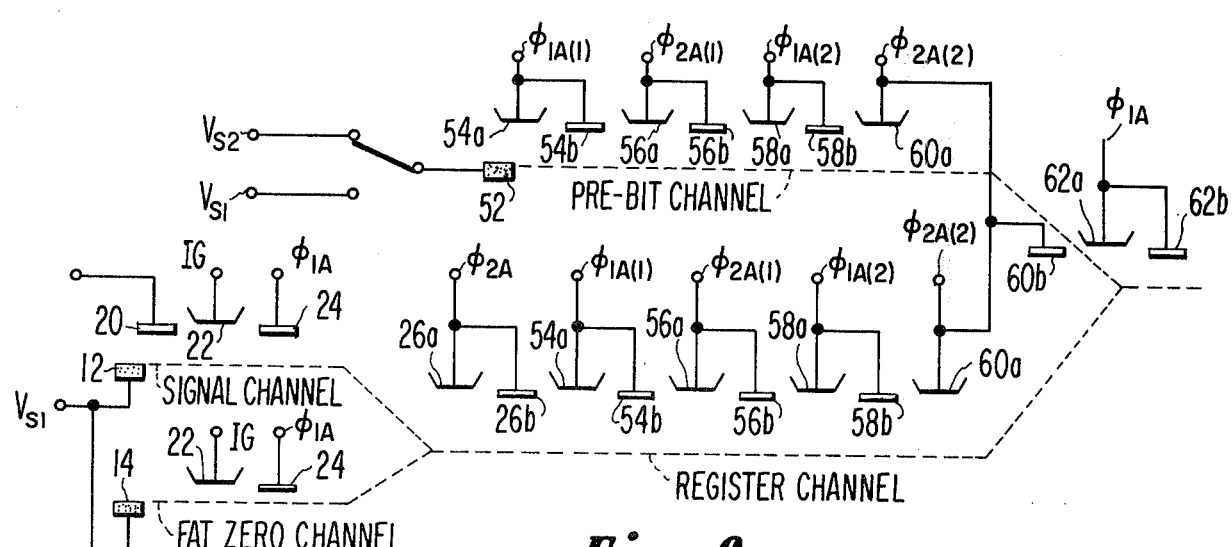
FIG. 8 is a schematic diagram of the structure of FIG. 7.

FIGS. 7 and 8 illustrate a solution to the problem above in accordance with an embodiment of the invention. The signal input structure (lower left of each figure) is substantially identical to the corresponding structure of FIG. 1 and similar parts are identified by similar reference numerals. However, in addition, there is a "pre-bit" channel through which one or more pre-bit charge packets are introduced in such manner that they arrive in the register channel immediately ahead of the first bit of the serial data being applied to the channel, as is discussed in more detail shortly. The amount of charge introduced by a pre-bit charge packet is not critical. Preferably it is close to the full well capacity—(say 90% to allow for thermal generation) so that it may be used to fill as many surface state traps as possible.

The prebit channel is defined by the channel stops 50a and 50b. It includes a P type region 52 such as a diffusion. This diffusion is shown to be at potential $V_S$. The voltage $V_S$ can assume one of two values. At one value, $V_{S1}$, which is relatively positive, region 52 acts as a source of holes. At the other value, $V_{S2}$, which is relatively negative, region 52 is relatively back biased sufficiently so that it does not act as a source of holes.

The propagation of charge along the pre-bit channel is controlled by the two phase electrode pairs such as 54a, 54b, 56a, 56b and so on.

In the operation of the arrangement of FIGS. 7 and 8, the source region 11, of which the input source regions 12 and 14 are a part, is maintained at a fixed potential $V_{S1}$ such as +15 volts. The periodic input gate pulses IG are applied to the aluminum electrode 22. The data input bit stream DI is applied to the polysilicon electrode 20. When the input signal is relatively positive, representing a zero, the signal channel is blocked and a fat zero is introduced in the fat zero channel. When the signal input DI is relatively negative, representing a one, a binary one charge packet is introduced into the signal channel and a fat zero charge packet is introduced into the fat zero channel. These two signals subsequently are combined in the register channel and represent a binary one in the manner already indicated.

When a new serial data bit stream is introduced into the register channel, the problem already discussed is present, namely the presence of traps at the substrate-insulator interface in the register channel which deteriorate the first few bits of the data stream. In accordance with the structure of FIG. 7, this problem is solved by introducing one or more pre-bit charge packets into the pre-bit channel. The source electrode 52 normally is maintained at a relatively negative value, such as $V_{S2}=+5$ volts, to prevent the introduction of charge into the pre-bit channel. However, after the parallel transfer of information out of the register channel and the start of the introduction of a new serial bit stream, $V_S$ is changed from $V_{S2}$ to $V_{S1}$. The mechanism for accomplishing this is illustrated schematically in FIG. 8 as a mechanical switch 52; in practice, of course, a control circuit is employed. This circuit may include a counter for counting the input binary signals DI and a decoder for producing an output in response to each M bits in the stream, where M is the capacity of the CCD register and may be some large number such as 64, 128, 256 or some larger number.

The voltage $V_{S1}$ applied to region 52 is the same $V_{S1}$ as applied to P type region 11 and may be a value such as +15 volts. The timing is such that the charge signal in the pre-bit channel becomes introduced beneath electrode pair 56a, 56b in the pre-bit channel, when the information signal is present under electrode pair 26a, 26b in the register channel. The pre-bit charge and the signal charge are subsequently propagated to the right by the electrodes 54a, 54b, 58a, 58b and so on so that the pre-bit charge packet arrives in the register channel beneath electrode 60b at the same time that the signal arrives beneath electrode 56b in the register channel. Thus, the charge packet introduced into the pre-bit channel fills the interface traps immediately ahead of the serial bit stream and greatly lessens the fast trapping state losses to the initial data bit(s) propagated into the channel as already discussed.

The charge packet introduced through the pre-bit channel subsequently propagates down the register channel ahead of the serial bit stream. Since this charge packet does not represent any information, it is ignored in the parallel data transfer which occurs after the register channel has filled. This may be done by simply shifting the first pre-bit charge out of the end of the register or, alternatively, by employing one additional register stage which is not used.

In the embodiment of the invention shown in FIG. 7, it may be observed that there is no fast interface state loss compensation of the information stored beneath electrode pairs 54a, 54b; 56a, 56b; and 58a, 58b in the register channel (1½ stages). However, it is found, in practice, that since only 1½ shift cycles are involved namely $\phi_{1A(1)}$, $\phi_{2A(1)}$ then $\phi_{1A(2)}$, that these losses are not significant.

While in the embodiment of the invention discussed above only a single bit is introduced in order to compensate for fast state trapping losses, in some cases it may be desirable to introduce two or more pre-bits. The number of pre-bits to be employed generally will depend upon the capacity of the shift register, that is, the number M of serial bits which can be shifted into and then temporarily stored in the register. More than one pre-bit may be introduced through the single pre-bit channel shown by "turning on" the source region 52 for a sufficient interval of time. For example, to introduce two bits, $V_S$ should remain relatively positive at $V_{S1}$ for the duration of two clock periods and these two clock periods should occur at times such that the pre-bits arrive at the wells beneath electrodes 62b and 60b when the first data bit arrives at the well beneath electrode 58b.

In some circumstances operating in the way above may introduce some timing problems. In such situations, rather than using a single pre-bit channel, two pre-bit channels, each like the one shown, would be employed. Here, one pre-bit woild be introduced in the first channel such as shown and the second pre-bit would be introduced in a second parallel channel. Both bits would be introduced at the same instant of time but in view of positions of the channels they would arrive in the register channel under two separate electrode pairs one pair immediately ahead of the second pair, and preferably immediately ahead of the first bit in the data stream.

The parallel transfer out of the register shown may be accomplished by the transfer gate pair 71a, 71b, shown in part in FIG. 7. The transfer occurs in response to a strobe pulse applied to the gates, ordinarily after the register is filled. The transfer, in the case of a serial-parallel-serial CCD memory is to one of the rows (not shown) of the matrix (not shown).

What is claimed is:

1. A charge coupled device shift register comprising, in combination:

a first charge coupled device register channel including a source of minority charge carriers, means for periodically introducing into said channel a fixed amount of charge signal from said source and means for shifting said charge signal down said channel;

a second charge coupled device register channel including a second source of minority charge carriers, means for periodically introducing into said second channel, concurrently with the introduction of said fixed amount of charge into said first channel, one of a charge signal from said second source in fixed proportion to that introduced into said first channel to represent one binary value, and no charge signal from said second source to represent the other binary value, and means for shifting the *a* and *b* charge signals down said second channel concurrently with the shifting of signals down said first channel;

a third charge coupled device register channel at the output end of said first and second channel for receiving each charge signal transmitted down said first channel and combining it with the corresponding charge signal *a* or *b*, as the case may be, received from the second channel, and including means for propagating the combined charge signal down said third channel;

a fourth charge coupled device register channel including a third source of minority charge carriers, means for introducing into said channel a charge signal from said third source, and means for propagating said charge signal down said fourth channel, said fourth channel connected at its output end to said third channel at a point beyond where said first and second channels join said third channel; and means for controlling said fourth charge coupled register channel to introduce one charge signal from said third source into said fourth channel only at the start of each stream of M charge signals introduced at said second channel, each such stream having a leading end, and timed so that said one charge signal reaches said third channel before and within, at most, several periods of the periodically introduced charge signals, of the time the leading end of said stream reaches the point where said fourth channel joins said third channel, where M is an integer equal to at least 10.

2. A charge coupled device shift register comprising, in combination;

a semiconductor substrate;

means defining first and second charge signal propagation channels in said substrate, each having an input end and output end;

means defining a third charge signal propagation channel in said substrate, having input and output ends, and joined at its input end to the output ends of said first and second channels;

means defining a fourth charge signal propagation channel in said substrate, having input and output ends and joined at its output end to a point along said third channel;

source electrodes in the substrate, one at the input end of the first channel, one at the input end of the second channel, and one at the input end of the fourth channel;

gate electrodes, each extending transversely across both said first and second channels, each coupled to the substrate in both channels, for controlling the propagation of charge down each channel in response to multiple phase shift voltages applied to said electrodes, and additional gate electrodes extending transversely across said third and fourth channels and coupled to the substrate in the third and fourth channels for controlling the propagation of charge received by said third channel from the first and second channels down the third channel and for controlling the propagation of charge signal down said fourth channel, both in response to said multiple phase shift voltages;

means coupled to the source electrode and substrate of said second channel for unconditionally introducing, once each shift period of one of the multiple phase voltages, a charge signal of given magnitude from said source electrode into said second channel;

means coupled to the source electrode and substrate of said first channel and responsive to an input signal representing a binary digit for introducing, once each shift period, a charge signal from said source electrode having substantially zero magnitude when said input signal represents one binary value and having a given magnitude greater than zero when said input signal represents the other binary value; and means coupled to the source electrode and substrate of said fourth channel, for introducing into said fourth channel a charge signal of given magnitude from said source electrode of said fourth channel only, at the start of each stream of M charge signals passing down said first channel, and time to reach said third channel ahead of said group of M such charge signals and within, at most, several shift periods of one of said multiple phase voltages of the time said stream of charge signals reaches said third channel, where M is an integer equal to at least 10.

3. The combination of:

a charge-coupled shift register having an input end, an intermediate region with M stages and an output end, where M is an integer equal to at least 10;

means coupled to said input end for serially introducing charge signals into said register;

means coupled to said intermediate region for propagating said charge signals down said register;

pre-bit charge generating means for producing charge signals of given magnitude, greater than zero, hereafter termed "precharge bits," said generating means coupled to a point in said intermediate region within M/10 stages of the input end of said register for introducing a precharge bit into said intermediate region, each time a stream of serially introduced charge signals is applied to said input end of said register after said register has been emptied, and timed to arrive at said point in the intermediate region before said stream of charge signals arrives at said point and within the time required for a charge signal to propagate through, at most, M/10 stages; and means for separating said precharge bits from said streams of serially introduced charge signals.

4. The combination as set forth in claim 3 wherein said pre-bit charge generating means comprises a second charge coupled shift register which includes means for introducing and propagating charge signals.

5. The combination of:

a surface channel charge coupled device register having a substrate;

means coupled to said register for serially introducing into said register successive streams of charge signals each and every signal representing a binary digit;

means coupled to said register for propagating each stream of said signals down said register;

means coupled to said register for transferring, in parallel, each stream of charge signals out of said register after that stream fills said register, to thereby leave behind unfilled traps at the surface of said substrate;

means for filling said traps comprising means for introducing into said register ahead of each stream of serially applied charge signals, and only once for each such stream, at least one charge signal of given magnitude and for subsequently transferring that charge signal of given magnitude and the following stream of charge signals down the register, said at least one charge signal of given magnitude filling said traps during its transfer down said register; and means for separating said at least one charge signal of given magnitude from each said stream of charge signals.

6. The combination as set forth in claim 5 wherein said means for serially introducing successive streams of charge signals comprises means for introducing fat zero signals at one relatively low level, substantially greater than zero, to represent binary digits of one value and one signal at a second substantially higher level to represent binary digits of the other value and wherein said means for introducing said charge signal of given magnitude comprises means for introducing a charge signal at a substantially higher level than said fat zero signal.

* * * * *

UNITED STATES PATENT OFFICE
CERTIFICATE OF CORRECTION

PATENT NO. : 4,010,485
DATED : March 1, 1977
INVENTOR(S) : Donald Jon Sauer

It is certified that error appears in the above-identified patent and that said Letters Patent are hereby corrected as shown below:

Column 2, line 35, "diffisuions" should be --diffusions--.

Column 3, line 8, "the" should be --The--.

Column 3, line 40, "l" should be --"1"--.

Column 6, line 28, "woild" should be --would--.

Column 6, line 58, after "one of" insert --(a)--.

Column 6, line 60, after "and" insert --(b)--.

Column 8, line 6, "introduing" should be --introducing--.

Signed and Sealed this

Third Day of May 1977

[SEAL]

Attest:

RUTH C. MASON
Attesting Officer

C. MARSHALL DANN
Commissioner of Patents and Trademarks